United States Patent [19]

Gottlieb et al.

[11] Patent Number: 4,497,012

[45] Date of Patent: Jan. 29, 1985

[54] DECOUPLING CAPACITOR AND METHOD OF MANUFACTURE THEREOF

[75] Inventors: Michael M. Gottlieb, Kraainem, Belgium; David S. Fishman, West Hartford, Conn.; Henri Buysse, Lochristi, Belgium

[73] Assignee: Rogers Corporation, Rogers, Conn.

[21] Appl. No.: 551,575

[22] Filed: Nov. 14, 1983

[51] Int. Cl.³ .................. H01G 9/05; H01G 7/00; H01G 4/10

[52] U.S. Cl. .................. 361/306; 29/25.42; 361/321; 361/433

[58] Field of Search .......... 29/25.42; 174/72 B; 361/321, 322, 306, 433, 392, 393, 402, 404

[56] References Cited

U.S. PATENT DOCUMENTS 3,588,629  6/1971  Millard et al. .................. 361/433
3,880,493  4/1975  Lockhart .................. 339/147 R
4,266,091  10/1978  Fukuda .................. 174/72 B
4,356,532  10/1982  Donaher et al. .................. 361/396
4,394,713  7/1883  Yoshda .................. 361/433

FOREIGN PATENT DOCUMENTS

41864  10/1974  Japan .
20556  2/1983  Japan .

Primary Examiner—Donald A. Griffin
Attorney, Agent, or Firm—Fishman & Dionne

[57] ABSTRACT

A decoupling capacitor and method of manufacture thereof are presented wherein the decoupling capacitor is formed in an in-line assembly and insert molding process. The decoupling capacitor is a hermetically sealed capacitive unit consisting of a ceramic chip, active leads and molded lugs for auto-insertion into printed circuit boards.

26 Claims, 8 Drawing Figures

DECOUPLING CAPACITOR AND METHOD OF MANUFACTURE THEREOF

BACKGROUND OF THE INVENTION

This invention relates to the field of decoupling capacitors for integrated circuits. More particularly, this invention relates to novel and improved decoupling capacitors, and methods of formation thereof wherein the capacitors are formed in an automated process of in-line assembly and insert molding to form decoupling capacitors which are auto-insertable into printed circuit boards for use in conjunction with dual-in-line integrated circuits or other electronic components.

U.S. patent application Ser. No. 403,408 (which is assigned to the assignee hereof, and the entire contents of which are incorporated herein by reference) discloses a decoupling capacitor for an integrated circuit package. The decoupling capacitor of that prior application is a thin rectangular chip of ceramic material which is metallized on opposite sides and has leads from the metallized coatings on opposite sides of the chip at two points adjacent a pair of diagonally opposed corners of the rectangularly shaped ceramic chip. The two leads are bent downwardly, and the decoupling capacitor assembly is encapsulated in a film of nonconductive material. In accordance with the teachings of that prior application, the decoupling capacitor is dimensioned so as to be received in the space between the two rows of leads extending from a conventional dual-in-line integrated circuit. The two leads from the decoupling capacitor are plugged into a printed circuit board, with these leads from the capacitor being inserted into the printed circuit through holes to which the ground power supply conductors are connected. The associated integrated circuit or other electronic component is then positioned over the capacitor and inserted into the board such that the power supply leads of the integrated circuit or other component will be positioned in the same through holes of the printed circuit board in which the two capacitor leads have been inserted.

The diagonally located leads or pins on the decoupling capacitor of application Ser. No. 403,408 have resulted in a problem when it is desired to automatically insert the decoupling capacitors into the printed circuit board. Standard auto-insertion equipment is available for inserting integrated circuit elements into the printed circuit boards. The insertion heads on standard auto-insertion equipment grasp the integrated circuit about the bent termnal pins or leads of the integrated circuit. Since there are two symmetric rows of pins on the integrated circuit element, the auto-insertion equipment can grasp the integrated circuit element symmetrically and stably for insertion. However, when insertion of the decoupling capacitor of prior application Ser. No. 403,408 is attempted with the same auto-insertion equipment, an unstable condition and misalignment results because of the fact that the decoupling capacitor, rather than having two symmetrical rows of pins, has only two pins at diagonally opposite corners of the rectangular capacitor. Because of the presence of only the two pins, the capacitor "cocks" in the insertion head with the result that misalignment occurs between the terminals of the capacitor in the corresponding holes on the printed circuit board.

Since it is extremely desirable to auto-insert the decoupling capacitors into the printed circuit boards, and since it is equally desirable to perform that auto-insertion with the same auto-insertion equipment used with the integrated circuit elements, a significant problem is encountered with the decoupling capacitor of the prior application, not from the standpoint of its electronic operability and effectiveness, but rather from the standpoint of adapting it to high volume assembly techniques.

A need also exists for a decoupling capacitor structure which is both auto-insertable, hermetically sealed, and capable of being manufactured by automated assembly processes.

U.S. patent application Ser. No. 456,654 (assigned to the assignee hereof) discloses one approach to solving the above discussed auto-insertion problem by the incorporation of dummy or stabilizing pins in a decoupling capacitor assembly. U.S. patent application Ser. No. 551,466 of Watson for Decoupling Capacitor and Method of Manufacture Thereof and U.S. patent application Ser. No. 552,107 for Improved Decoupling Capacitor of David S. Fishman, both of which are being filed simultaneously herewith and are assigned to the assignee hereof present other constructions of and methods for forming decoupling capacitors with dummy pins or molded stabilizing lugs. The present invention presents other constructions of and methods for forming improved decoupling capacitors which are hermetically sealed, auto-insertable and manufactured in an automated process of in-line assembly and insert molding.

SUMMARY OF THE INVENTION

The above discussed and other problems of the prior art are overcome or substantially reduced by the new and improved decoupling capacitor of the present invention. Also, several additional advantages in design, assembly, cost, reliability and quality are realized with the present invention.

In accordance with the present invention, a subassembly of the decoupling capacitor is formed in an automated, in-line assembly process; and the subassembly is then employed as an insert in an insert molding process to form a hermetically sealed decoupling capacitor.

The in-line assembly process of the present invention results in high speed automated construction of a subassembly for the decoupling capacitor. The subassembly consists of the capacitive ceramic chip with active leads bonded thereto on opposite sides thereof. This subassembly is employed as an insert in an insert molding process to produce the final hermetically sealed decoupling capacitor which has dummy lugs integrally formed in the molded housing for auto-insertion purposes. The subassembly is formed in an in-line strip process employing a continuous band of a suitable metal alloy. Connection plates and active leads are punched in the metal band or strip; the capacitive chips are bonded to the connection plates to form the subassembly; and the subassembly is then insert molded.

The assembly process may be carried out in a continuous process or in a series of discontinuous groups of steps. Also, a strip of subassemblies may be used as inserts in a multi-station transfer mold, whereby a plurality of the decoupling capacitors may be formed in each insert molding step.

In addition to solving the misalignment problem and being suitable for auto-insertion, the decoupling capacitor of the present invention and the process of formation thereof have several other advantages and potentials. The decoupling capacitor of the present invention is hermetically sealed in the insert molding step, thereby sealing the capacitor elements from environmental hazards. The process of the present invention is particularly suitable for high speed production of the decoupling capacitors in large quantities, with a minimum number of components being required to make the product, and this process presents opportunities for reduced costs along with overall improvement in quality.

Another feature and advantage of the present invention is that the terminal pins project from the sides of the body at approximately the same height or level even though being physically and electrically connected to opposite sides or faces of the capacitor. This feature enhances the uniformity and symmetry of the product and may contribute to increased stability in handling during auto-insertion.

The above discussed and other advantages of the present invention will be apparent to and understood by those skilled in the art from the following detailed description and drawings.

BRIEF DESCRIPTION OF THE DRAWINGS

Referring now to the several figures of the drawings, wherein like elements are numbered alike in the several figures.

DESCRIPTION OF THE PREFERRED EMBODIMENTS

Figure 1A:
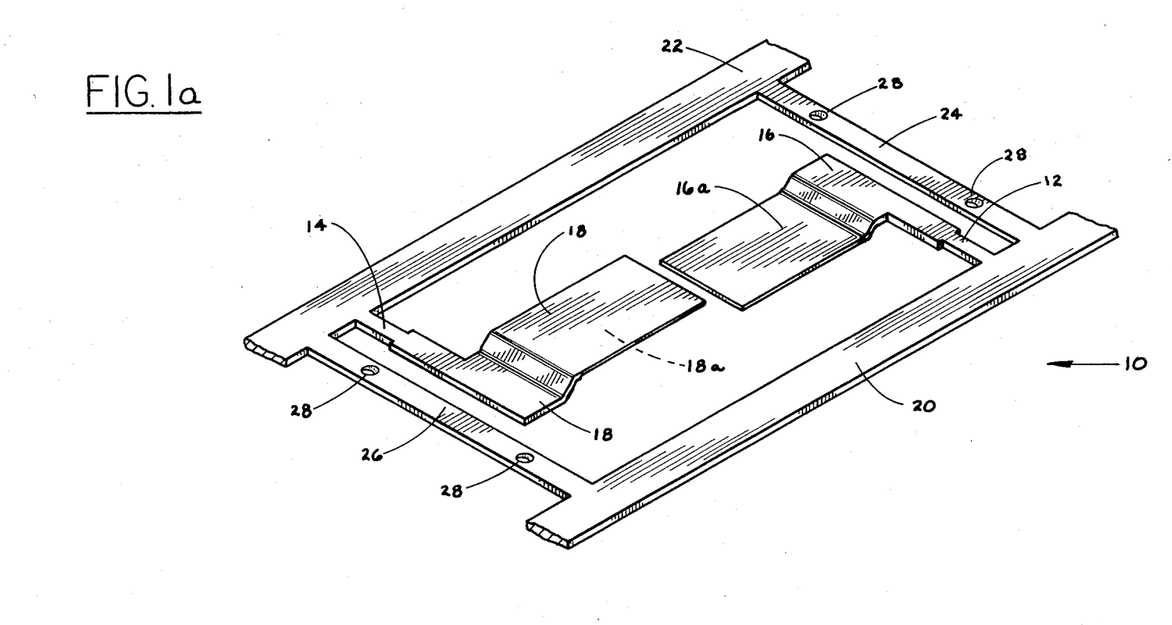
FIG. 1A is a perspective view of a first stage of subassembly components and construction of the capacitive element in accordance with the present invention.
Figure 6:
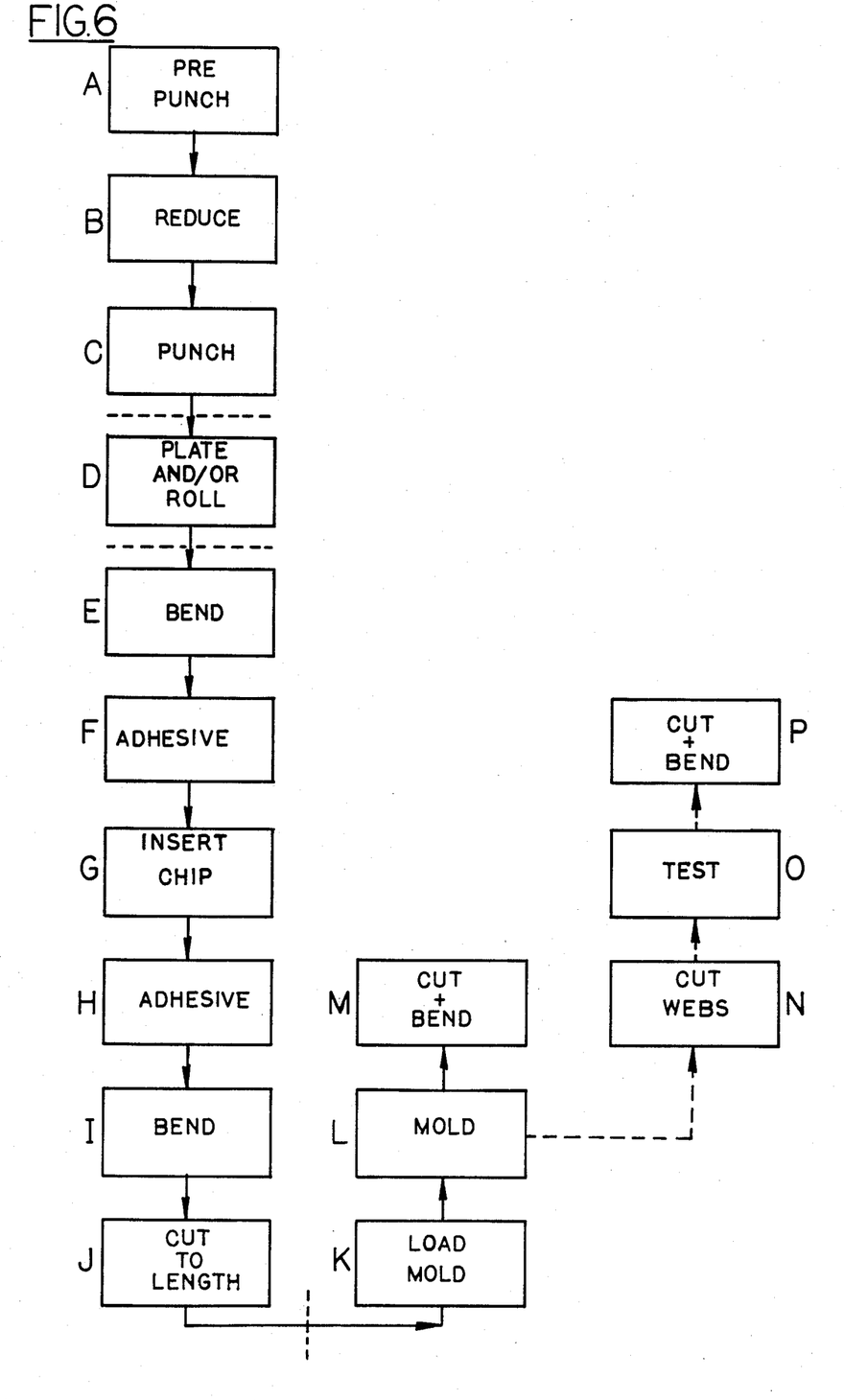
FIG. 6 is a block flow diagram of the manufacturing process in accordance with the present invention.

Referring to a joint consideration of FIGS. 1A and 6, subassembly components are punched from a continuous strip or band of metal, such as copper alloy, of 0.25 mm (0.010 inch) thick and of suitable width for the requirements of the component being made. A portion of the continuous copper band is shown in FIG. 1A after various punching steps have been performed to form a band of windows 10 which in their open interiors have the basic form of contact pins 12 and 14 and connection plates 16 and 18. The exterior or perimeter of each window 10 is made up of a pair of edge strips 20 and 22 and transverse connecting webs 24 and 26 which remain after the punching operations have taken place to form the structure within the windows.

Figure 2:
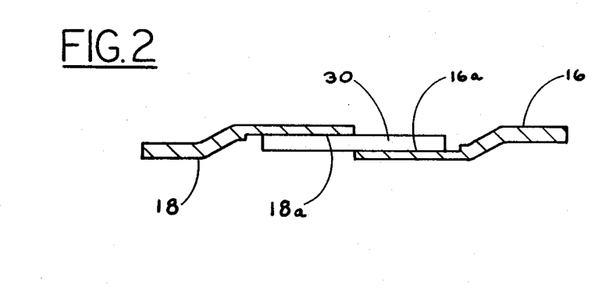
FIG. 2 is a cross-sectional elevation view through a completed subassembly unit in accordance with the embodiment of FIGS. 1A and 1B.

The structure of FIG. 1A is formed from the continuous band of copper in a series of process steps indicated as steps A, B and C in FIG. 6. In step A, a preliminary punching step is performed whereby relief holes or windows are punched to remove parts of the unwanted areas from within the interior of the window frame. The material then advances to the next station wherein the metal thickness is reduced by about 40% in the areas where the connection plates 16 and 18 are to be formed. This reduction of metal thickness, which is accomplished by punch pressing, is done from the top for plate 16 and from the bottom for plate 18, whereby the step downs in thickness (at plate surfaces 16(a) and 18(a)) will accommodate a ceramic capacitor chip which is eventually to be installed between the two areas of reduced thickness. The thickness of the reduced sections 16(a) and 18(a) is each about 0.006 inch. Depending on the thickness of the ceramic chip being used (i.e., if it is greater than the combined thickness reductions of 0.008 inch of both plates 16(a) and 18(a)), the connecting webs between the plates and pins can be bent or formed with an "S" curve or "Z" step to lower plate 16(a) and raise plate 18(a) (as seen in FIGS. 1A and 2) to receive the chip between the plates. This bending of or forming may also be accomplished in step B.

The strip of material then advances to the next stage of the punching tool wherein material is removed to form the array of terminal contact pins 12 and 14 and connection plates 16 and 18 within the window as shown in FIG. 1A in process step C. In this process step C, locating or alignment holes 28 are also punched into the continuous copper band for alignment and registration purposes in further process steps.

It will be noted that the connecting plates 16 and 18 are of approximately equal size, these plates being formed by cutting the copper strip midway between the terminal pins 12 and 14. It is also to be noted that the tooling which accomplishes the punching can be so designed that the distance between the center of the terminal pins 12 and 14 and the size of the connection plates 16 and 18 may be varied to accommodate a range of center-to-center distances for the connecting pins and connecting plate sizes in the final product.

Following process step C, the copper band is passed through a tin plating operation so that all metal surfaces are suitably plated. This plating is indicated as process step D in FIG. 6. The plating may be accomplished in a continuous operation immediately following punching step C, or the copper strip may be rewound after punching step C and plated at a subsequent time. Also, either before or after plating step D, the copper strip may be rewound and stored for future use, or it may continue on to the further processing steps of step E, et seq. The fact that step D may be carried out as a continuous part of the process or as an interrupted part of the process is indicated by the dashed lines between steps C and E.

Figure 1B:
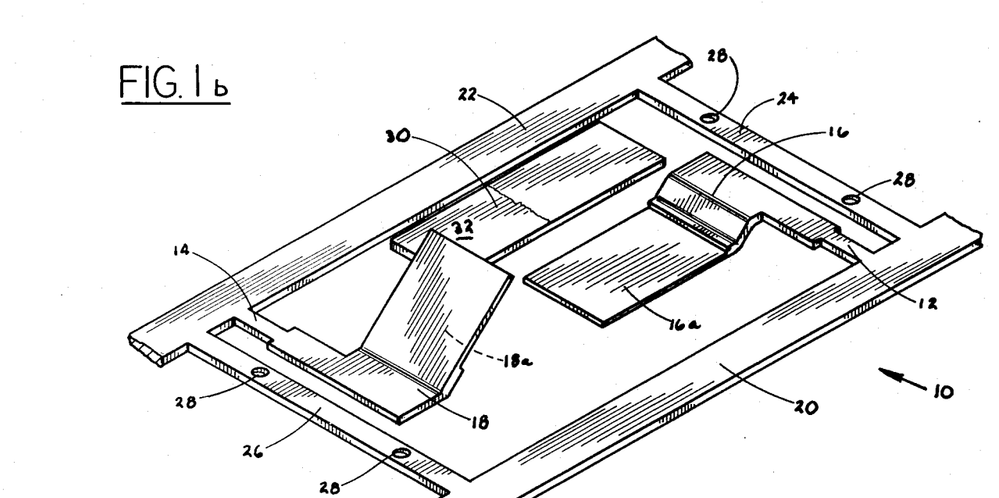
FIG. 1B is a perspective view of a second stage of subassembly components and construction of the capacitive element in accordance with the present invention.

Referring now to FIGS. 1B and 6, the punched copper strip next enters an assembly line which has an advancing system which picks up and registers with the locating holes 28 which were previously formed in the window frame of the band. At the first stage of the assembly line, in step E, connection plate 18 is bent upwardly to an angle of approximately 60° from the horizontal, as shown in FIG. 1B. The band then advances to the next stage of the assembly line where, in step F, an adhesive is applied to the reduced thickness upper face 16(a) of connection plate 16. The band then advances to the next stage of the assembly operation where, in step G, a capacitive chip is placed on the adhesive coated surface 16(a) of plate 16 and held against that adhesive surface until the conductive adhesive has cured and solidified so that the capacitive chip is securely bonded to plate 16 to permit further handling and good electrical connection.

The capacitive chip inserted into the assembly in step G may, conveniently, be stored in a dispensing magazine for sequential insertion into the assembly. The capacitive chips are formed in a separate operation and consist of a ceramic capacitor element, such as barium titinate in the form of a flat generally rectangular plate, with conductive surfaces formed on opposing faces of the plate. Preferably, the upper and lower flat faces of the ceramic chip are coated with nickel or nickel alloy in accordance with U.S. patent application Ser. No. 391,967 which is assigned to the assignee hereof and the entire contents of which are incorporated herein by reference.

After the capacitive chip has been bonded to plate 16, the band then advances to the next stage in the assembly line where, in step H, an adhesive is deposited on that portion 32 of the upper surface of capacitive chip 30 which is to eventually underlie and contact plate surface 18(a). The band then advances to the next station in the assembly line where, in step I, connection plate 18 is bent down to its original horizontal position where it makes contact with the adhesive coated on surface 32 of the capacitive chip. Connection plate 18 is held under pressure against chip surface 32 until the conductive adhesive cures to the point where good electrical and mechanical connection is established so that the band can be further advanced.

The adhesive between plates 16 and 18 and the conductive face surfaces of the capacitive chip may be electrically nonconductive, with electrical contact between the plates and the chip being established by the differential roughness between the plate surfaces and the chip faces (as disclosed in U.S. Pat. No. 4,236,038, which is assigned to the assignee hereof and which is incorporated herein by reference). Alternatively, the adhesive may be electrically conductive.

It is to be noted that in FIG. 1B conductive chip 30 is, for purposes of illustration, shown within the window 10 but prior to insertion into position between the connecting plates 16 and 18. Also, it should be noted that at both adhesive steps F and H chip 30 is adequately supported so that it will not be cracked or damaged during the bonding operation.

Each assembly of a pair of terminal pins 12 and 14 and a pair of connection plates 16 and 18 bonded to a capacitor chip 30 constitutes a subassembly of a decoupling capacitor of the present invention. At this stage in the processing, each subassembly is still attached to the side rails 20 and 22 of the original copper band, and the connecting webs 24 and 26 are still in place.

The band of material then advances to the next station in the assembly operation where the band, in step J, is cut into lengths comprising a desired number of subassemblies in each length. These lengths of subassembly units may then be stored for future use or may be moved directly to further processing steps for insert molding in accordance with the present invention. Once again, the dashed line in the flow diagram following step J indicates that the strips or lengths of subassemblies may be stored for further processing or may pass directly to the further processing steps.

The strip or length of connected subassemblies is next transferred to and charged, in step K, into an appropriately designed multi-station transfer mold (with the number of stations in the mold equalling the number of subassemblies on the strip). Each subassembly constitutes an insert for one station in the transfer mold. The mold is then closed, and in step L, the subassembly is then encapsulated as a molded insert in a suitably selected low pressure epoxy transfer molded plastic. In step L, the entire subassembly of capacitor 30, plates 16 and 18 and terminal pins 12 and 14 is encapsulated with the exception of that portion of pins 12 and 14 which is shown bent down and exposed in FIG. 3 to form a plurality of encapsulated decoupling capacitors as shown in FIG. 3.

Figure 3:
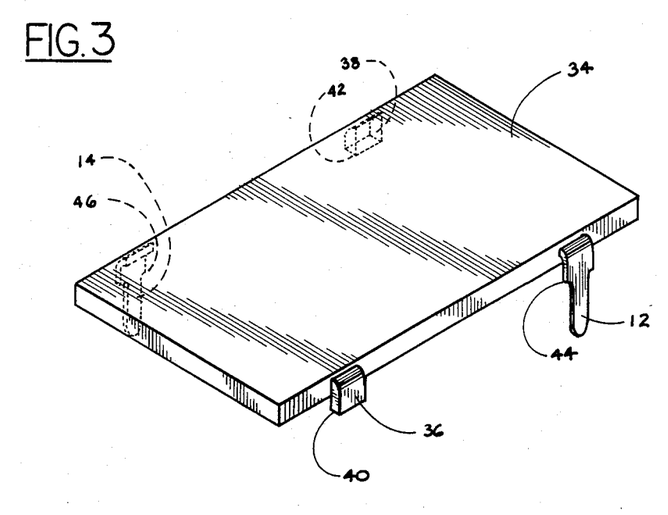
FIG. 3 is a perspective view of a completed decoupling capacitor in accordance with the present invention.

In the next step of the manufacturing process, the strip of molded decoupling capacitor packages is removed from the transfer mold and passed through a suitable punch or cutting tool which, in step M, severs the ends of pins 12 and 14 from edge strips 20 and 22 and bends pins 12 and 14 downwardly from the horizontal position as shown in FIG. 1B to the vertical position shown in FIG. 3. This step separates the individual decoupling capacitors from the strip as a finished product, and the finished product is then ready for testing, marking, burn-in and packaging for storage or shipment.

As an alternative to step M, the transverse webs 24 and 26 may be severed in step N, thus leaving the capacitor elements still connected to edge strips 20 and 22. It is then possible to gang-test, mark and burn-in the capacitors in this strip array in step O, and thereafter sever the pins 12 and 14 from the edge strips 20 and 22 and bend the pins in step P, which corresponds to step M.

As seen in FIG. 3, the final product after molding and severing consists of the encapsulated subassembly, previously described, encapsulated within a plastic outer housing 34. Plastic housing 34 contains integrally molded lugs 36 and 38 which are formed during the molding of package 34 as a result of appropriate recesses in the mold cavity. The final overall shape of the decoupling capacitor is generally rectangular, as shown in FIG. 3. Terminal pins 12 and 14 are located at one pair of diagonally opposite corners of the rectangular structure, and lugs 36 and 38 are located at the other pair of diagonally opposite corners of the unit. Lugs 36 and 38 constitute stablizing surfaces which provide the necessary symmetry to the assembly for the unit to be gripped by the jaws of an automatic insertion machine for automatic insertion into a printed circuit board. Lugs 36 and 38 are formed so that their exterior contours are the same as the contours of pins 12 and 14 after the pins have been bent. In addition, the bottom surfaces 40 and 42 of the lugs are at the same level as shoulders 44 and 46 on pins 12 and 14. Shoulders 44 and 46 on the terminal pins and the bottom surfaces 40 and 42 of the stabilizing lugs cooperate to hold the decoupling capacitor package slightly off the printed circuit board on which it is mounted and absolutely parallel thereto for appropriate cooling and alignment with an integrated circuit to be mounted relative to the decoupling capacitor.

Figure 4A:
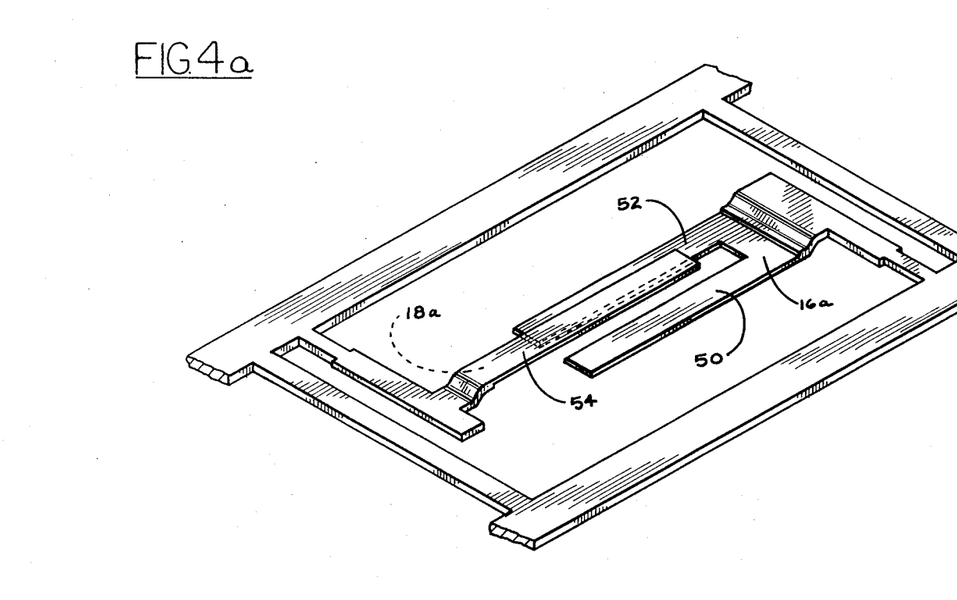
FIG. 4A is a view similar to FIG. 1A showing an alternative embodiment.
Figure 4B:
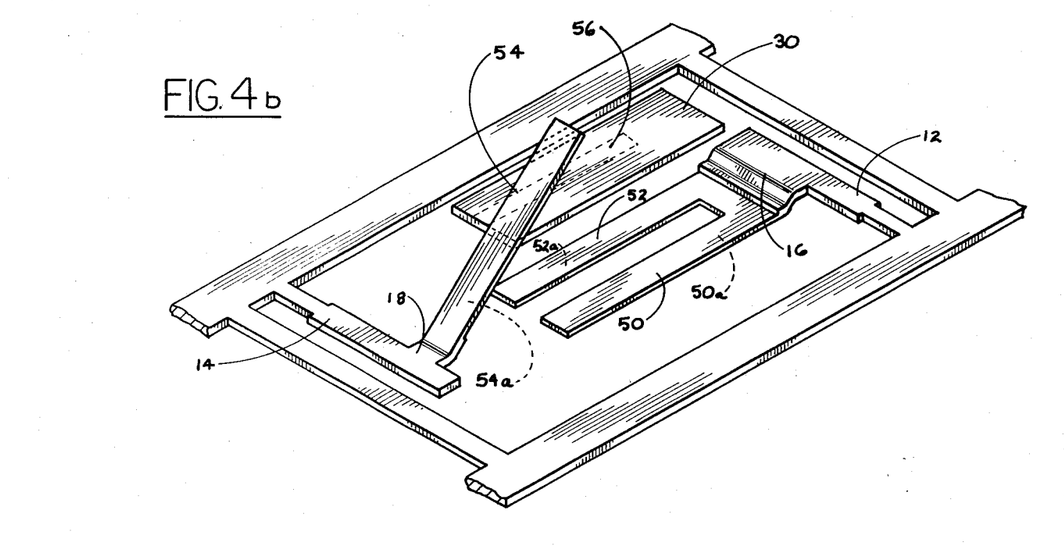
FIG. 4B is a view similar to FIG. 1B of the alternative embodiment.
Figure 5:
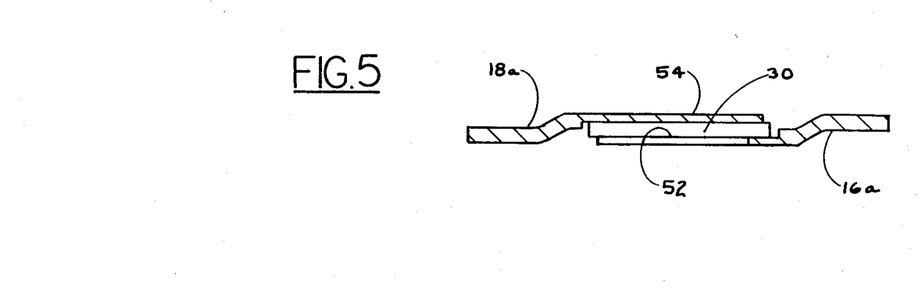
FIG. 5 is a sectional elevation view of a completed subassembly in accordance with the embodiment of FIGS. 4A and 4B.

Referring to FIGS. 4A, 4B and 5, an alternative subassembly structure is shown. This embodiment differs from the embodiment of FIGS. 1A, 1B and 2 only in regard to that part of the connection plates 16 and 18 which contact the capacitor chip 30. In this second embodiment, the connection plates 16 has a pair of elongated fingers 50 and 52 which are spaced apart, and connection plate 18 has a single elongated finger 54 which overlies the space between fingers 50 and 52.

Obviously, these fingers are punched from a single sheet of material, and at the processing stage of FIG. 4A they are in an interdigitating array. As with the embodiment of FIGS. 1A, 1B and 2, in this second embodiment the opposed surfaces 50(a), 52(a) and 54(a) of the fingers of the connection plates are reduced approximately 40% in thickness. This reduction of metal thickness is done from the top for fingers 50 and 52 (and the web between them) of connection plate 16, and from the bottom of finger 54 for connection plate 18. All other processing steps of FIG. 6 apply to the second embodiment, with the single modification that the conductive adhesive applied to the upper surface 32 of capacitor 30 is applied in a line or path down the middle of surface 32 (indicated in phantom at 56 in FIG. 4A) to correspond to the shape of finger 54.

The embodiment of FIGS. 4A, 4B and 5 permits capacitor chip 30 to be supported underneath by fingers 50 and 52 along most of its length, which is not possible with the embodiment of FIGS. 1A, 1B and 2.

The end product of the embodiment of FIGS. 4A, 4B and 5 has the same exterior configuration and appearance as shown in FIG. 3.

The automated manufacturing process of the present invention results in significant economies in manufacturing the decoupling capacitors hereof. In addition, the end product is hermetically sealed and ruggedly constructed, and it is suitable for use with auto-insertion equipment. Thus, the present invention affords substantial advantages both in its manufacturing process and the end product resulting therefrom.

Another feature and advantage of the present invention is that the terminal pins 12 and 14 project from the sides of body 34 at approximately the same height or level even though being physically and electrically connected to opposite sides or faces of capacitor 30. This feature enhances the uniformity and symmetry of the product and may contribute to increased stability in handling during auto-insertion.

The present invention has been discussed in the general configuration of a decoupling capacitor having axial symmetry, with a pair of diagonally opposed active terminal pins and a pair of diagonally opposed stabilizing lugs. However, it will be understood that this configuration is described for purposes of illustration of the preferred configuration for use with an integrated circuit having diagonally opposed power supply pins; but the present invention is not limited to this configuration. The decoupling capacitor of the present invention can be configured as may be dictated by the configuration and requirements of the integrated circuit or other electronic component with which it is to be used. Thus, for example, if the power supply pins of the integrated circuit are not at diagonally opposed locations, the stabilizing lugs will be located at such other locations, as may be dictated by the location of the power supply pins, to balance the power supply pins; and the number of active pins of the decoupling capacitor may be more than two (to match an IC having more than two power leads); and the number and location of stabilizing lugs need not always be symmetrical with respect to the active pins; all of the above being within the general requirement that the active leads and stabilizing lugs be arranged to provide a balanced array of stabilized engagement sites or surfaces for engagement by the jaws of auto insertion equipment. Also, dummy pins (i.e., pins similar to the active terminal pins but not electrically connected to the capacitive element) may be employed instead of stabilizing lugs.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. The method of making a capacitor, including the steps of:
   removing unwanted material from a strip of electrically conductive material to define a first connection plate and a first terminal pin connected thereto and a second connection plate and a second terminal pin connected thereto;
   reducing the thickness of at least a part of each of said first and second connection plates to define surfaces for connection to a capacitive element;
   displacing said first connector plate relative to said second connection plate to provide an entrance passage for insertion of a capacitive element;
   placing a capacitive element on said second connection plate said capacitive element having first and second conductive surfaces, with one conductive surface of said capacitive element in contact with said second connection plate;
   displacing said first connection plate relative to said second connection plate to bring said first connection plate into contact with the other conductive surface of said capacitive element;
   bonding said first and second connector plates to said capacitive element; and
   encapsulating the structure thus formed to enclose and seal all of the structure other than said first and second terminal pins.

2. The method of claim 1 wherein said step of removing material includes:
   a preliminary step wherein some material is removed prior to the step of reducing the thickness; and
   a secondary step of removing material to finally define said connector plates and terminal pins subsequent to the step of reducing thickness.

3. The method of claim 1 including:
   forming a bend in at least one of said connecting plates between the terminal pin and the part of reduced thickness.

4. The method of claim 1 wherein said step of bonding includes:
   applying an adhesive to said second connector plate prior to placing said capacitive element therein; and
   applying an adhesive to the exposed conductive surface of said capacitive element prior to displacing said first connector plate into contact therewith.

5. The method of claim 1 wherein:
   said first and second terminal pins are connected to edge strips, said terminal pins being severed from said edge strips after the step of encapsulating.

6. The method of claim 5 wherein:
   said edge strips are interconnected by transverse webs which cooperate with said edge strips to define a window; and including the step of:
   forming alignment holes in said transverse webs during said step of removing unwanted material.

7. The method of claim 1 wherein:

said terminal pins are at diagonally opposite locations, and said step of molding includes molding a pair of diagonally opposite stabilizing lugs.

8. The method of making a decoupling capacitor, including the steps of:

forming a subassembly of a plurality of decoupling capacitor elements by:
(a) removing unwanted material from a strip of electrically conductive material to define a plurality of pairs of first and second connection plates and pairs of first and second terminal pins connected, respectively to the first and second connection plates, each of said pairs of first and second terminal pins being connected to edge strips of said conductive material and said edge strips having transverse webs therebetween with alignment holes therein;
(b) reducing the thickness of at least a part of each of said first and second connection plates to define surfaces for connection to a capacitive element;
(c) displacing each of said first connection plates relative to its associated second connection plate to provide an entrance passage for insertion of a capacitive element between each pair of connection plates;
(d) placing a capacitive element on said second connection plate of each pair of plates, said capacitive element having first and second conductive surfaces, with one conductive surface of said capacitive element being in contact with said second connection plate;
(e) displacing said first connection plate relative to the second connection plate of each pair of plates to bring each of said first plates into contact with the other conductive surface of the capacitive element; and
(f) bonding each of said first and second connection plates to the capacitive element therebetween;

placing the subassembly formed in (a) through (f) above in a multi-station mold, with each pair of connection plates and the capacitive element therebetween constituting an insert for a station in the mold;

introducing a molding material into the mold to encapsulate each insert to enclose and seal each insert other than the first and second terminal pins thereof, and define a plurality of encapsulated capacitor elements;

removing the plurality of encapsulated capacitor elements from the mold; and severing the plurality of encapsulated capacitor elements from said edge strips.

9. The method of claim 8 wherein said step of removing material includes:
a preliminary step wherein some material is removed prior to the step of reducing the thickness; and
a secondary step of removing material to finally define said connector plates and terminal pins subsequent to the step of reducing thickness.

10. The method of claim 8 including:
forming a bend in at least one of said connecting plates between the terminal pin and the part of reduced thickness.

11. The method of claim 8 wherein said step of bonding includes:

applying an adhesive to said second connector plate prior to placing said capacitive element therein; and applying an adhesive to the exposed conductive surface of said capacitive element prior to displacing said first connector plate into contact therewith.

12. The method of claim 8 wherein:
said first and second terminal pins are connected to edge strips, said terminal pins being severed from said edge strips after the step of encapsulating.

13. The method of claim 12 wherein:
said edge strips are interconnected by transverse webs which cooperate with said edge strips to define a window; and including the step of:
forming alignment holes in said transverse webs during said step of removing unwanted material.

14. The method of claim 8 wherein:
said terminal pins are at diagonally opposite locations, and said step of molding includes molding a pair of diagonally opposite stabilizing lugs.

15. A decoupling capacitor including:
a first electrically conductive connection plate having a section of reduced thickness on one side thereof;
a second electrically conductive connection plate having a section of reduced thickness on one side thereof, said sections of reduced thickness facing each other;
a first terminal pin extending from said first connection plate;
a second terminal pin extending from said second connection plate;
said first and second terminal pins being at diagonally opposite locations of the decoupling capacitor;
a capacitive element between the reduced thickness sections of said first and second connection plates, said capacitive element having a pair of conductive face surfaces electrically connected to said sections of reduced thickness;
a molded encapsulating cover encapsulating said connection plates and capacitive element, with said terminal pins extending from said encapsulating cover at a first pair of diagonally opposed positions; and
a pair of diagonally opposed stabilizing lugs formed as part of said encapsulating cover, said stabilizing lugs being at a second pair of diagonally opposed positions.

16. The capacitor of claim 15 wherein:
said capacitive element is a ceramic material with a pair of conductive face surfaces.

17. The capacitor of claim 15 wherein:
said capacitive element is bonded to said connection plates.

18. The capacitor of claim 15 including:
a oontoured section between the terminal pin and the section of reduced thickness on at least one of said connection plates.

19. The capacitor of claim 15 including:
a contoured section between the terminal pin and the section of reduced thickness on each of said first and second connection plates.

20. The capacitor of claim 15 wherein:
said stabilizing lugs have an exterior contour approximating the exterior contour of at least part of said terminal pins.

21. An array of decoupling capacitors positioned between a pair of edge strips from which connection plates and terminal pins of the capacitors are formed, each of said decoupling capacitor having:
- a first electrically conductive connection plate having a section of reduced thickness on one side thereof;
- a second electrically conductive connection plate having a section of reduced thickness on one side thereof, said sections of reduced thickness facing each other;
- a first terminal pin extending from said first connection plate;
- a second terminal pin extending from said second connection plate;
- each of said first and second terminal pins being connected to an opposed one of said pair of edge strips;
- said first and second terminal pins being at diagonally opposite locations of the decoupling capacitor;
- a capacitive element between the reduced thickness sections of said first and second connection plates, said capacitive element having a pair of conductive face surfaces electrically connected to said sections of reduced thickness;
- a molded encapsulating cover encapsulating said connection plates and capacitive element, with said terminal pins extending from said encapsulating cover at a first pair of diagonally opposed positions; and
- a pair of diagonally opposed stabilizing lugs formed as part of said encapsulating cover, said stabilizing lugs being at a second pair of diagonally opposed positions.

22. The array of decoupling capacitors as in claim 21 wherein:
   said capacitive element is a ceramic material with a pair of conductive face surfaces.

23. The array of decoupling capacitors as in claim 21 wherein:
   said capacitive element is bonded to said connection plates.

24. The array of decoupling capacitors as in claim 21 including:
   a contoured section between the terminal pin and the section of reduced thickness on at least one of said connection plates.

25. The array of decoupling capacitors as in claim 21 including:
   a contoured section between the terminal pin and the section of reduced thickness on each of said first and second connection plates.

26. The array of decoupling capacitors as in claim 21 wherein:
   said stabilizing lugs have an exterior contour approximating the exterior contour of at least part of said terminal pins.

* * * * *